(12) United States Patent
Lee

(10) Patent No.: US 10,224,379 B2
(45) Date of Patent: Mar. 5, 2019

(54) ORGANIC LIGHT EMITTING DIODE DEVICE WITH DIFFERENT LAMINATED STRUCTURES

(71) Applicant: Innolux Corporation, Miao-Li County (TW)

(72) Inventor: Chun-Kai Lee, Maio-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/808,957

(22) Filed: Nov. 10, 2017

(65) Prior Publication Data
US 2018/0158884 A1    Jun. 7, 2018

(30) Foreign Application Priority Data

Dec. 2, 2016    (CN) .......................... 2016 1 1099268

(51) Int. Cl.
| | |
|---|---|
| *H01L 51/50* | (2006.01) |
| *H01L 27/32* | (2006.01) |
| *H01L 51/52* | (2006.01) |
| *H01L 51/56* | (2006.01) |

(52) U.S. Cl.
CPC ........ *H01L 27/3218* (2013.01); *H01L 27/322* (2013.01); *H01L 27/3213* (2013.01); *H01L 27/3216* (2013.01); *H01L 51/504* (2013.01); *H01L 51/5004* (2013.01); *H01L 51/506* (2013.01); *H01L 51/508* (2013.01); *H01L 51/5052* (2013.01); *H01L 51/5056* (2013.01); *H01L 51/5064* (2013.01); *H01L 51/5068* (2013.01); *H01L 51/5076* (2013.01); *H01L 51/5084* (2013.01); *H01L 51/5265* (2013.01); *H01L 51/56* (2013.01); *H01L 51/5072* (2013.01); *H01L 51/5218* (2013.01); *H01L 51/5234* (2013.01); *H01L 2251/5315* (2013.01); *H01L 2251/552* (2013.01)

(58) Field of Classification Search
None
See application file for complete search history.

(56) References Cited

U.S. PATENT DOCUMENTS

| | | | |
|---|---|---|---|
| 2005/0242712 A1* | 11/2005 | Sung ................... | H01L 27/3211 313/503 |
| 2014/0353635 A1* | 12/2014 | Chou ................... | H01L 27/3211 257/40 |

* cited by examiner

*Primary Examiner* — Minh-Loan Tran
(74) *Attorney, Agent, or Firm* — McClure, Qualey & Rodack, LLP

(57) ABSTRACT

An organic light emitting diode (OLED) display device is provided. The OLED device includes a substrate, a first light emitting unit and a second light emitting unit. The first light emitting unit is disposed on the substrate. The first light emitting unit includes a first organic light emitting layer, a second organic light emitting layer and a first charge generation unit. The first charge generation unit is located between the first organic light emitting layer and the second organic light emitting layer. The first organic light emitting layer and the second organic light emitting layer are respectively in contact with a top surface and a bottom surface of the first charge generation unit. The second light emitting unit is disposed on the substrate. The second light emitting unit includes a third organic light emitting layer, and the second light emitting unit does not include a charge generation unit.

19 Claims, 4 Drawing Sheets

ORGANIC LIGHT EMITTING DIODE DEVICE WITH DIFFERENT LAMINATED STRUCTURES

This application claims the benefit of People's Republic of China application Serial No. 201611099268.0, filed Dec. 2, 2016, the subject matter of which is incorporated herein by reference.

BACKGROUND

Field of the Invention

The present disclosure is related in general to an organic light emitting diode (OLED) device, and particularly to an OLED device including OLED units with different laminated structures.

Description of the Related Art

People's pursuit to high brightness and high color saturation of images visible to human eyes has led the developments and applications of color display technology. In daily life, applications of displays are everywhere, such as banners, televisions, vehicle navigations, and etc. Various types of display panels have been developed, such as CRT displays in early times, plasma displays, liquid crystal displays, and organic light emitting diode (OLED) displays in current times.

The manufacture of OLED displays requires the manufacture of OLED devices with excellent qualities. Therefore, how to provide an OLED device with excellent display qualities or manufacturing competitiveness is still one of the research topics in industry.

SUMMARY OF THE INVENTION

The present disclosure is directed to an organic light emitting diode (OLED) device. In the embodiments, the OLED device includes OLED units with different laminated structures, and the different laminated structures may include a tandem OLED unit (the first light emitting unit) and a non-tandem OLED unit (the second light emitting unit), such that the effects of increasing luminous intensity can be achieved without significantly increasing power consumption. The following description of the embodiments of the present disclosure is made with reference to the accompanying drawings.

According to an embodiment of the present disclosure, an organic light emitting diode (OLED) device is provided. The OLED device includes a substrate, a first light emitting unit and a second light emitting unit. The first light emitting unit is disposed on the substrate. The first light emitting unit includes a first organic light emitting layer, a second organic light emitting layer and a first charge generation unit. The first charge generation unit is located between the first organic light emitting layer and the second organic light emitting layer. The first organic light emitting layer and the second organic light emitting layer are respectively in contact with a top surface and a bottom surface of the first charge generation unit. The second light emitting unit is disposed on the substrate. The second light emitting unit includes a third organic light emitting layer, and the second light emitting unit does not include a charge generation unit.

The above and other aspects of the disclosure will become better understood with regard to the following detailed description of the preferred but non-limiting embodiment(s). The following description is made with reference to the accompanying drawings.

DETAILED DESCRIPTION OF THE INVENTION

Figure 1:
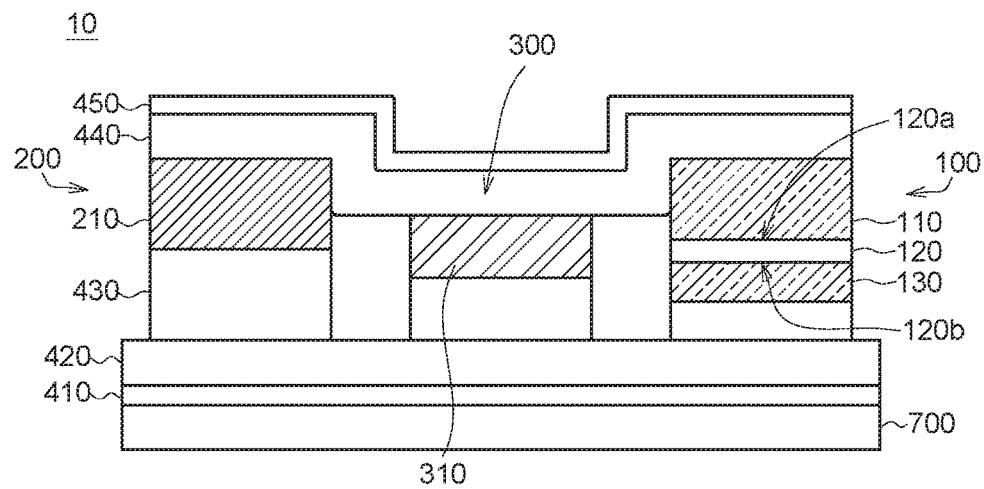
FIG. 1 shows a schematic drawing of an organic light emitting diode (OLED) device according to an embodiment of the present disclosure.

According to the embodiments of the present disclosure, the OLED device includes OLED units with different laminated structures, and the different laminated structures may include a tandem OLED unit (the first light emitting unit) and a non-tandem OLED unit (the second light emitting unit), such that the effects of increasing luminous intensity can be achieved without significantly increasing power consumption. The following description of the embodiments of the present disclosure is made with reference to the accompanying drawings. The elements sharing similar or the same labels are similar or the same elements in the drawings. It is to be noted that the accompanying drawings are simplified for clearly describing the disclosure. The detailed structures disclosed in the embodiments are for exemplification only, not for limiting the scope of protection of the disclosure. One of ordinary skills in the art may modify or change the structures according to actual needs. Besides, when a layer is "on" another layer or "on" a substrate, it may indicate that the layer is "directly on" the another layer or "directly on" the substrate, or alternatively, it may also indicate that the layer is "indirectly on" the another layer or "indirectly on" the substrate, suggesting that an intervening layer may be located between the layer and the another layer or the substrate. When a layer "is in contact with" another layer or "is in contact with" a substrate, it may indicate that the layer "is in direct contact with" the another layer or "is in direct contact with" the substrate, or alternately, it may also indicate that the layer "is in indirect contact with" the another layer or "is in indirect contact with" the substrate, suggesting that an intervening layer may be located between the layer and the another layer or the substrate. In addition, the sequence numbers, such as "first," "second," "third," and etc., used in the specification as well as in claims are for illustrating components in the claims, the terms themselves do not represent that there are any order and/or sequence referred to the claimed components, and these terms do not represent that there may be any sequence between certain claimed component and another claimed component or any sequence of the manufacturing processing steps. The use of these sequence numbers is for clearly distinguishing a claimed component from another claimed component having same nomenclature.

FIG. 1 shows a schematic drawing of an organic light emitting diode (OLED) device according to an embodiment of the present disclosure. As shown in FIG. 1, the OLED device 10 may include a substrate 700, a first light emitting unit 100 and a second light emitting unit 200. The first light emitting unit 100 is disposed on the substrate 700. The first light emitting unit 100 may include a first organic light emitting layer 110, a first charge generation unit 120 and a second organic light emitting layer 130. The first charge generation unit 120 may be located between the first organic light emitting layer 110 and the second organic light emitting layer 130. The first organic light emitting layer 110 and the second organic light emitting layer 130 may be respectively in contact with a top surface 120a and a bottom surface 120b of the first charge generation unit 120. The second light emitting unit 200 is disposed on the substrate 700. The second light emitting unit 200 and the first light emitting unit 100 may be arranged in parallel. The second light emitting unit 200 may include a third organic light emitting layer 210, and the second light emitting unit 200 may not include a charge generation unit. In the present embodiment, the charge generation unit (e.g. the first charge generation unit 120) may have a single-layered structure or a multi-layered structure, but the disclosure is not limited thereto. In the embodiments, the charge generation unit may include a charge generation layer, an electron transport layer and a hole transport layer, and the charge generation layer is located between the electron transport layer and the hole transport layer. In other embodiments, the charge generation unit may include different layers, and the disclosure is not limited thereto. In the embodiments, the material of the charge generation layer may include an N-type doped material or a P-type doped material, the N-type doped material may be Alq3 doped Li, the P-type doped material may be NPT doped $MoO_3$, but the disclosure is not limited thereto.

In other words, according to the embodiments of the present disclosure, the first light emitting unit 100 may be a tandem OLED unit, and the second light emitting unit 200 may not include a charge generation unit and thus is a non-tandem OLED unit. That is, according to the embodiments of the present disclosure, the OLED device may include OLED units with different laminated structures, and the different laminated structures may include a tandem OLED unit and a non-tandem OLED unit; therefore, not all of the light emitting units are tandem OLED units or non-tandem OLED units.

As shown in FIG. 1, the OLED device 10 may further include a first electrode layer 410, a hole injection layer 420, a hole transport layer 430, an electron transport layer 440 and a second electrode layer 450. The hole injection layer 420 may be located on the first electrode layer 410, the hole transport layer 430 may be located on the hole injection layer 420, the electron transport layer 440 may be located on the third organic light emitting layer 210 or the first organic light emitting layer 110, and the second electrode layer 450 may be located on the electron transport layer 440. According to the embodiments of the present disclosure, the third organic light emitting layer 210 of the second light emitting unit 200 may receive holes provided from such as the hole transport layer 430 and electrons provided from such as the electron transport layer 440, and the combinations of the electrons and the holes form photons. However, since the two organic light emitting layers in a tandem OLED unit are stacked vertically, only one of the two organic light emitting layers can be in contact with one of the electron transport layer 440 and the hole transport layer 430. For example, the first organic light emitting layer 110 of the first light emitting unit 100 is in contact with the electron transport layer 440, the electron transport layer 440 can provide electrons to the first organic light emitting layer 110, but only a small amount of holes from the hole transport layer 430 can pass through the second organic light emitting layer 130 and reach the first organic light emitting layer 110, resulting in a very low probability of forming photons in the first organic light emitting layer 110. Therefore, the first charge generation unit 120 may be disposed between the first organic light emitting layer 110 and the second organic light emitting layer 130 of the tandem OLED unit; in such case, the first charge generation unit 120 can generate both holes and electrons, which are provided to the first organic light emitting layer 110 and the second organic light emitting layer 130 respectively, such that photons can be formed in both of the first organic light emitting layer 110 and the second organic light emitting layer 130 of the first light emitting unit 100, and the number of the generated photons may be about twice the number of photons generated by the second light emitting unit 200. As such, when a fixed current is provided, the first light emitting unit 100 can provide higher luminous intensity compared to that provided by a non-tandem OLED unit, for example, the luminous intensity of the first light emitting unit 100 may be about twice the luminous intensity of a non-tandem OLED unit. In other words, compared to a non-tandem OLED unit, a tandem OLED unit can provide a similar luminous intensity when a lower current is provided, and thus a tandem OLED unit can have a longer lifetime. In the present embodiment, the second light emitting unit 200 adopts the structure of a non-tandem OLED unit, such that the situation of a higher power consumption, which is caused by the higher voltage resulting from the longer resonance cavity of the first light emitting unit 100, can be avoided. Therefore, according to the embodiments of the present disclosure, the OLED device includes OLED units with different laminated structures, and the different laminated structures may include a tandem OLED unit (the first light emitting unit 100) and a non-tandem OLED unit (the second light emitting unit 200), such that the effects of increasing luminous intensity can be achieved without significantly increasing power consumption.

In the embodiments, the first organic light emitting layer 110 and the second organic light emitting layer 130 may include a fluorescent luminescent material, and the third organic light emitting layer 210 may include a phosphorescent luminescent material, a fluorescent luminescent material or the combination of the both. However, the above materials are for exemplification only, and the present disclosure is not limited thereto.

In the embodiments, the first organic light emitting layer 110 and the second organic light emitting layer 130 may have the same luminous colors, such as emitting blue lights, and the first light emitting unit 100 is such as a blue light emitting unit. However, the above is for exemplification only, and the present disclosure is not limited thereto.

In the embodiments, as shown in FIG. 1, the OLED device 10 may further include a third light emitting unit 300, and the third light emitting unit 300 is disposed on the substrate 700. The third light emitting unit 300, the first light emitting unit 100 and the second light emitting unit 200 may be arranged in parallel.

In the embodiment, as shown in FIG. 1, the third light emitting unit 300 may include a fourth organic light emitting layer 310, and the third light emitting unit 300 may not include a charge generation unit.

In the embodiments, the first organic light emitting layer 110 (and the second organic light emitting layer 130), the third organic light emitting layer 210 and the fourth organic light emitting layer 310 may have different luminous colors. The third organic light emitting layer 210 emits such as red lights, and the second light emitting unit 200 is such as a red light emitting unit; the fourth organic light emitting layer 310 emits such as green lights, and the third light emitting unit 300 is such as a green light emitting unit. However, the above is for exemplification only, and the present disclosure is not limited thereto.

In the embodiments, the first light emitting unit 100, the second light emitting unit 200, and the third light emitting unit 300 may be located between the first electrode layer 410 and the second electrode layer 450. In other embodiments, the OLED device 10 may further include an electron injection layer (not shown in drawings) disposed between the second electrode layer 450 and the electron transport layer 440, but the present disclosure is not limited thereto.

In the embodiments, the first electrode layer 410 or the second electrode layer 450 may be a reflective electrode, such as a silver electrode with a thickness of such as larger than 25 nm; in other embodiments, the first electrode layer 410 or the second electrode layer 450 may be a semi-penetrating electrode, such as a silver electrode with a thickness of such as less than 25 nm or a Mg—Ag alloy electrode with a thickness of such as less than 25 nm. In further embodiments, the first electrode layer 410 or the second electrode layer 450 may be a transparent electrode layer, such as an ITO electrode. However, the above is for exemplification only, and the present disclosure is not limited thereto.

Figure 2:
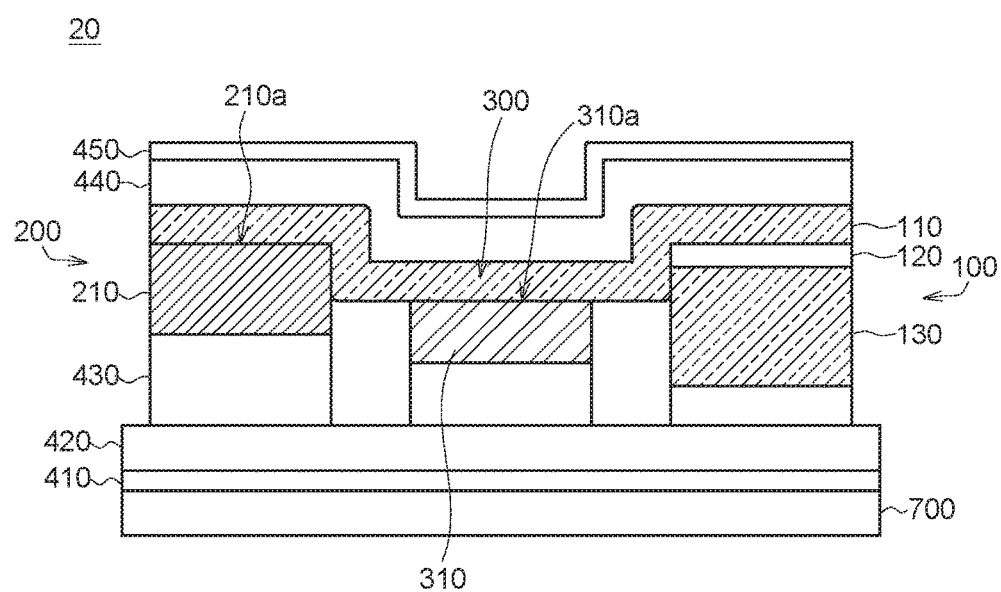
FIG. 2 shows a schematic drawing of an OLED device according to another embodiment of the present disclosure.

FIG. 2 shows a schematic drawing of an OLED device according to another embodiment of the present disclosure. The elements in the embodiment sharing similar or the same labels with those in the previous embodiment are similar or the same elements, and the description of which is omitted.

In the embodiment, as shown in FIG. 2, the structures of the OLED device 20 and the OLED device are similar, and the difference is that in the OLED device 20, the first organic light emitting layer 110 extends and is in contact with the third organic light emitting layer 210 of the second light emitting unit 200; for example, the first organic light emitting layer 110 is in contact with a top surface 210a of the third organic light emitting layer 210.

In the embodiment, as shown in FIG. 2, the first organic light emitting layer 110 extends and is in contact with the fourth organic light emitting layer 310 of the third light emitting unit 300; for example, the first organic light emitting layer 110 is in contact with a top surface 310a of the fourth organic light emitting layer 310.

In the embodiments, the material of the first organic light emitting layer 110 may be such as an electron transport material, such that the region of the first organic light emitting layer 110 located in the second light emitting unit 200 and the third light emitting unit 300 can be provided with the effect of transporting electrons, which effect is similar to that of the electron transport layer 440. Since only a small amount of holes can pass through the third organic light emitting layer 210 and the fourth organic light emitting layer 310 to reach the first organic light emitting layer 110, thus the probability of forming photons in the first organic light emitting layer 110 in the second light emitting unit 200 and the third light emitting unit 300 is very low, and accordingly, the luminous colors of the second light emitting unit 200 and the third light emitting unit 300 are less affected.

According to the embodiment as shown in FIG. 2, the manufacturing process of forming the first organic light emitting layer 110 does not require fine metal masks, thus the alignment errors possibly occurred in fine metal mask processes can be reduced, and accordingly, the difficulty of the manufacturing process is reduced, and the effects of simplifying the manufacturing process can be achieved.

In some embodiments, the energy gap between the lowest unoccupied molecular orbital (LUMO) of the material of the first organic light emitting layer 110 and the LUMO of the material of the third organic light emitting layer 210 is such as larger than or equal to 0 eV and smaller than or equal to 0.5 eV. In other embodiments, the energy gap between the LUMO of the material of the first organic light emitting layer 110 and the LUMO of the material of the third organic light emitting layer 210 is such as larger than or equal to 0 eV and smaller than or equal to 0.3 eV. However, the present disclosure is not limited to the above examples.

In some embodiments, the energy gap between the LUMO of the material of the first organic light emitting layer 110 and the LUMO of the material of the fourth organic light emitting layer 310 is such as larger than or equal to 0 eV and smaller than or equal to 0.5 eV. In other embodiments, the energy gap between the LUMO of the material of the first organic light emitting layer 110 and the LUMO of the material of the fourth organic light emitting layer 310 is such as larger than or equal to 0 eV and smaller than or equal to 0.3 eV. However, the present disclosure is not limited to the above examples.

Figure 3:
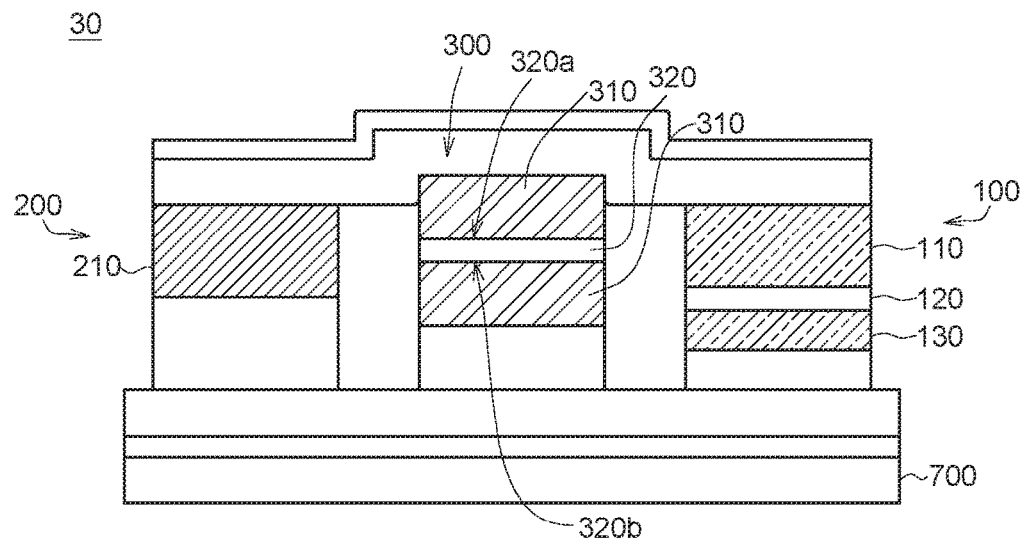
FIG. 3 shows a schematic drawing of an OLED device according to a further embodiment of the present disclosure.

FIG. 3 shows a schematic drawing of an OLED device according to a further embodiment of the present disclosure. The elements in the embodiment sharing similar or the same labels with those in the previous embodiments are similar or the same elements, and the description of which is omitted.

In the embodiments, as shown in FIG. 3, the OLED device 30 may further include a third light emitting unit 300, and the third light emitting unit 300 is disposed on the substrate 700. The third light emitting unit 300, the first light emitting unit 100 and the second light emitting unit 200 may be arranged in parallel.

In the present embodiment, the third light emitting unit 300 may include two fourth organic light emitting layers 310 and a second charge generation unit 320. The second charge generation unit 320 may be located between the two fourth organic light emitting layers 310, and the two fourth organic light emitting layers 310 may be respectively in contact with a top surface 320a and a bottom surface 320b of the second charge generation unit 320.

In other words, in the present embodiment, the OLED device 30 includes OLED units with different laminated structures, and the different laminated structures may include two tandem OLED units (the first light emitting unit 100 and the third light emitting unit 300) and a non-tandem OLED unit (the second light emitting unit 200), such that the effects of increasing luminous intensity can be achieved without significantly increasing power consumption. In other embodiments (not shown in drawings), the different laminated structures may include two tandem OLED units (the first light emitting unit 100 and the second light emitting unit 200) and a non-tandem OLED unit (the third light emitting unit 300), but the present disclosure is not limited thereto.

Figure 4:
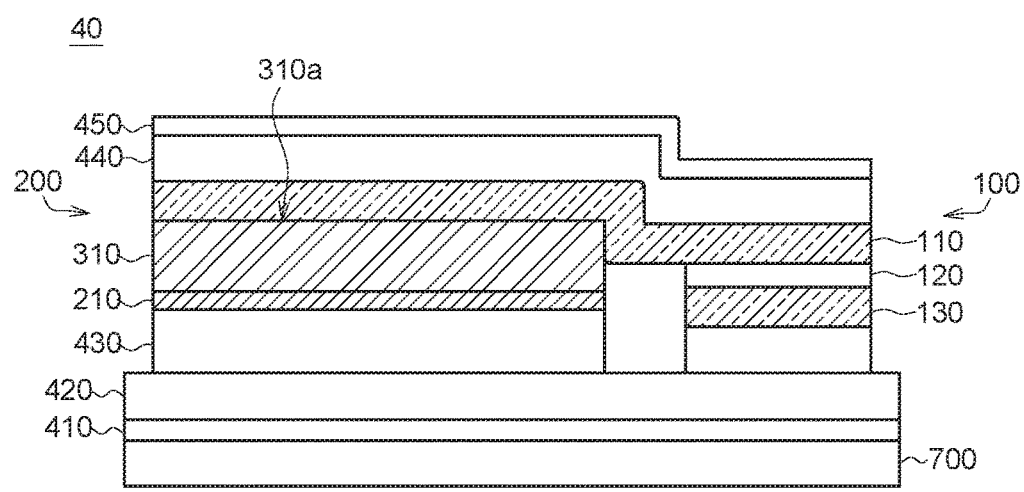
FIG. 4 shows a schematic drawing of an OLED device according to a still further embodiment of the present disclosure.

FIG. 4 shows a schematic drawing of an OLED device according to a still further embodiment of the present disclosure. The elements in the embodiment sharing similar or the same labels with those in the previous embodiments are similar or the same elements, and the description of which is omitted.

In the embodiment, as shown in FIG. 4, the second light emitting unit 200 of the (SLED device 40 may include the third organic light emitting layer 210 and the fourth organic light emitting layer 310, the fourth organic light emitting layer 310 is overlapped with the third organic light emitting layer 210, and the third organic light emitting layer 210 and the fourth organic light emitting layer 310 may have different luminous colors.

For example, the third organic light emitting layer 210 emits such as red lights, the fourth organic light emitting layer 310 emits such as green lights, and the second light emitting unit 200 of the present embodiment is such as a yellow light emitting unit. However, the above is for exemplification only, and the present disclosure is not limited thereto.

In the embodiment, as shown in FIG. 4, the first organic light emitting layer 110 extends and is in contact with the fourth organic light emitting layer 310 of the second light emitting unit 200 of the present embodiment; for example, the first organic light emitting layer 110 is in contact with a top surface 310a of the fourth organic light emitting layer 310.

In the embodiments, the materials of the first organic light emitting layer 110 and the fourth organic light emitting layer 310 may be such as an electron transport material, such that the region of the first organic light emitting layer 110 and the region of the fourth organic light emitting layer 310 located in the second light emitting unit 200 can be provided with the effect of transporting electrons, which effect is similar to that of the electron transport layer 440. Since only a small amount of holes can pass through the third organic light emitting layer 210 and the fourth organic light emitting layer 310 to reach the first organic light emitting layer 110, the probability of forming photons in the first organic light emitting layer 110 in the second light emitting unit 200 is very low, and thus the luminous color of the second light emitting unit 200 is less affected. In addition, the material of the third organic light emitting layer 210 may be such as a hole transport material, such that the third organic light emitting layer 210 and the fourth organic light emitting layer 310 can emit lights with corresponding luminous colors respectively, and thus the lights can be effectively mixed to create an emitted light with a predetermined luminous color of the second light emitting unit 200. In the present embodiment, the third organic light emitting layer 210 and the fourth organic light emitting layer 310 of the second light emitting unit 200 are stacked vertically. In other embodiments, the organic light emitting layer of the second light emitting unit 200 may be a single-layered structure formed of mixtures of luminescent materials with two different luminous colors. In further embodiments, the organic light emitting layer of the second light emitting unit 200 may be a single-layered structure formed of a luminescent material for emitting yellow lights. However, the present disclosure is not limited to the above examples.

According to the embodiments of the present disclosure, the manufacturing processes of forming the second organic light emitting layer 130 and the third organic light emitting layer 210 require only two fine metal mask processes, and the fourth organic light emitting layer 310 may be formed by the coating process or the evaporation process which forms the third organic light emitting layer 210, without requiring an additional fine metal mask process; in addition, the manufacturing process of forming the first organic light emitting layer 110 does not require a fine metal mask process. Accordingly, the alignment errors possibly occurred in fine metal mask processes can be reduced, thus the difficulty of the manufacturing process is reduced, and the effects of simplifying the manufacturing process can be achieved.

Figure 5A:
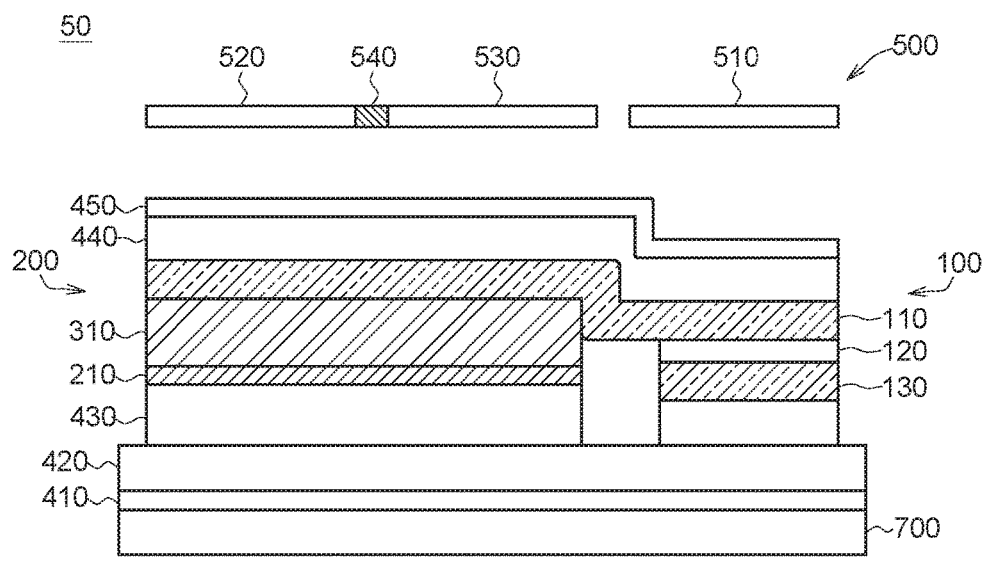
FIGS. 5A-5B show schematic drawings of OLED devices according to some additional embodiments of the present disclosure.
Figure 5B:
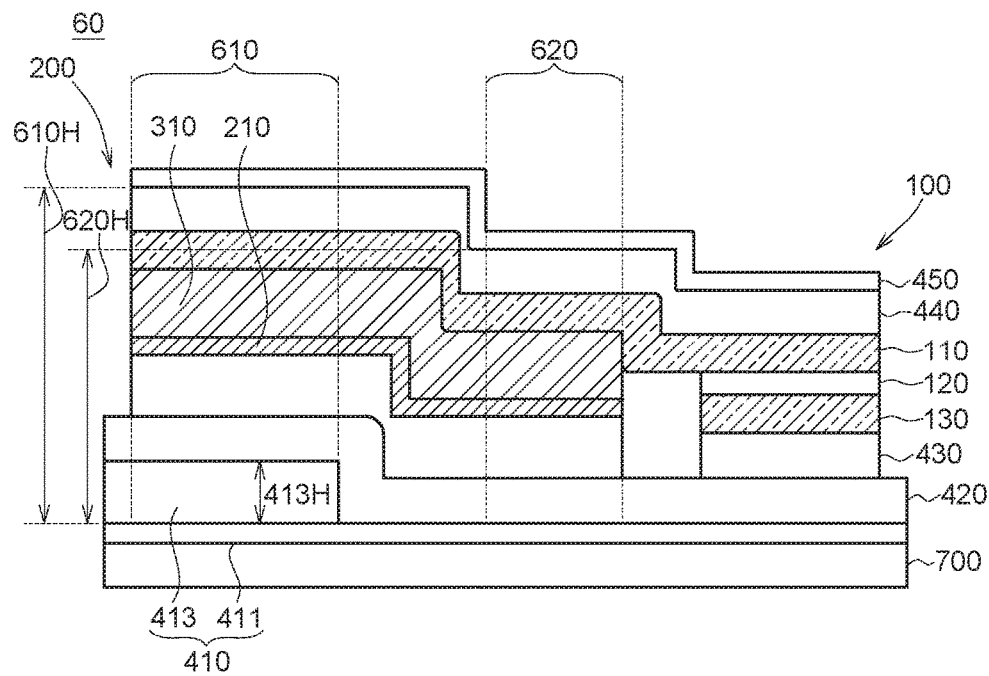

FIGS. 5A-5B show schematic drawings of OLED devices according to some additional embodiments of the present disclosure. The elements in the embodiment sharing similar or the same labels with those in the previous embodiments are similar or the same elements, and the description of which is omitted.

In the embodiments, as shown in FIG. 5A, the OLED device 50 may further include a color filter layer 500, and the color filter layer 500 may be disposed corresponding to the first light emitting unit 100 and the second light emitting unit 200.

As shown in FIG. 5A, the color filter layer 500 may include a first color region 510, a second color region 520 and a third color region 530. The second color region 520 and the third color region 530 may be located on the second light emitting unit 200, and the first color region 510 may be located on the first light emitting unit 100. In the embodiments, the second color region 520 and the third color region 530 can allow lights with different wavelength ranges to pass through, and thus after lights are emitted from the second light emitting unit 200, the emitted lights can have different luminous colors after passing through the second color region 520 and the third color region 530.

The color filter layer 500 may further include a black matrix 540, and the black matrix 540 isolates the second color region 520 from the third color region 530 to prevent undesired color-mixing. The black matrix 540 may be formed of any light-shielding material, but the present disclosure is not limited thereto.

For example, the first organic light emitting layer 110 and the second organic light emitting layer 130 emit such as blue lights, and the first light emitting unit 100 is such as a blue light emitting unit; the third organic light emitting layer 210 emits such as red lights, the fourth organic light emitting layer 310 emits such as blue lights, and the second light emitting unit 200 is such as a yellow light emitting unit. The second color region 520 may include such as a red color filter material for allowing red lights to pass through, and the third color region 530 may include such as a blue color filter material for allowing green lights to pass through. The first color region 510 may be formed of a transparent material or may be an opening for allowing the blue lights emitted from the first light emitting unit 100 to pass through. In other embodiments, the first color region 510 may include a blue color filter material for increasing the blue color saturation. However, the above is for exemplification only, and the present disclosure is not limited thereto.

In some embodiments, a distance between the color filter layer 500 and the second electrode layer 450 is such as larger than or equal to 0 μm and smaller than or equal to 30 μm. In some other embodiments, the distance between the color filter layer 500 and the second electrode layer 450 may be such as larger than or equal to 0 μm and smaller than or equal to 10 μm. However, the present disclosure is not limited to the above examples.

In the embodiments, as shown in FIG. 5B, in the OLED device 60, the first electrode layer may include a reflective electrode layer 411 and a transparent electrode layer 413, and the transparent electrode layer 413 may be located on a partial surface of the reflective electrode layer 411. The second electrode layer 450 may be located on the first organic light emitting layer 110.

In the embodiment, the reflective electrode layer 411 is such as a silver electrode, and the transparent electrode layer 413 is such as an ITO electrode. However, the above is for exemplification only, and the present disclosure is not limited thereto.

In the embodiments, as shown in FIG. 5B, the second light emitting unit 200 may have a fourth color region 610 and a fifth color region 620. The fourth color region 610 may be corresponding to the transparent electrode layer 413, and the fifth color region 620 may be located between the fourth color region 610 and the first light emitting unit 100.

In the embodiments, as shown in FIG. 5B, the transparent electrode layer 413 located in the fourth color region 610 has a height 413H, such that in the second light emitting unit 200, the resonance cavity length 610H of the fourth color region 610 is longer than the resonance cavity length 620H of the fifth color region 620, and the emitted lights from the fourth color region 610 and from the fifth color region 620 of the second light emitting unit 200 can have different luminous colors by adjusting the resonance cavity length 610H and the resonance cavity length 620H. In the present embodiment, the surface of the transparent electrode layer 413 may be an irregular surface, and the height of the transparent electrode layer 413 refers to the average height of the transparent electrode layer 413. In the present embodiment, the resonance cavity length refers to the distance between the top surface of the reflective electrode layer 411 and the bottom surface of the second electrode layer 450, as shown in FIG. 5B. In other embodiments, the top surface of the reflective electrode layer 411 and/or the bottom surface of the second electrode layer 450 may be irregular surfaces, and thus the resonance cavity length refers to the average resonance cavity length.

Figure 6A:
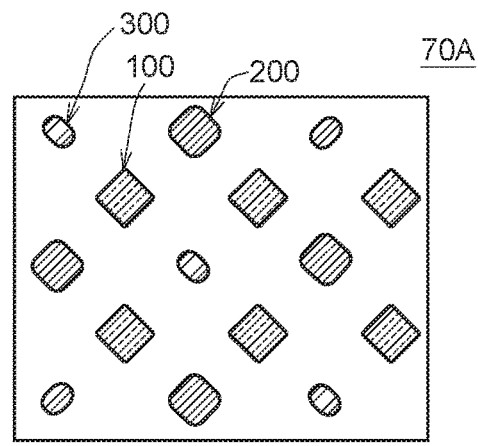
FIGS. 6A-6C show top views of OLED devices according to some embodiments of the present disclosure.
Figure 6B:
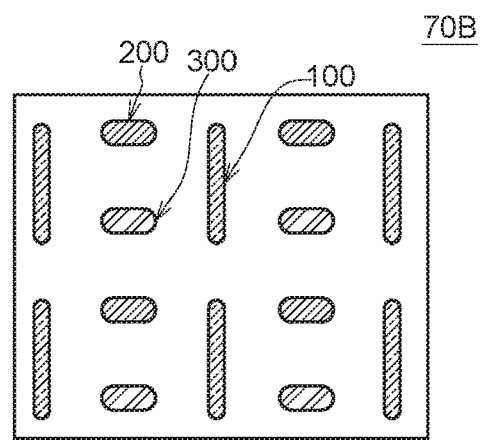
Figure 6C:
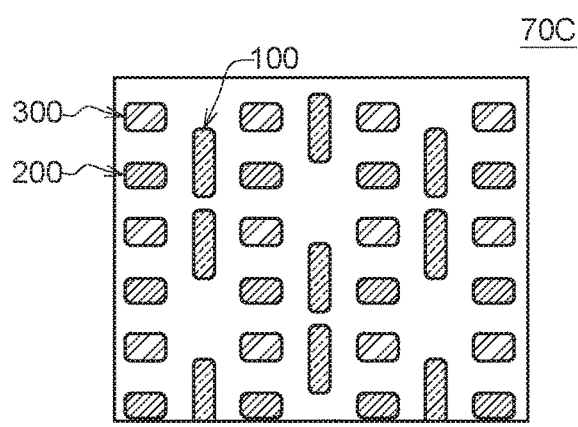

FIGS. 6A-6C show top views of OLED devices according to some embodiments of the present disclosure. The elements in the embodiment sharing similar or the same labels with those in the previous embodiments are similar or the same elements, and the description of which is omitted. It is to be noted that some components of the OLED devices in FIGS. 6A-6C are omitted for clearly describing the details of the embodiments of the disclosure.

The OLED devices as shown in FIGS. 6A-6C are presented for illustrating the arrangements of the first light emitting unit 100, the second light emitting unit 200 and the third light emitting unit 300 in some embodiments. The first light emitting unit 100 is such as a blue light emitting unit, the second light emitting unit 200 is such as a red light emitting unit, and the third light emitting unit 300 is such as a blue light emitting unit, but the present disclosure is not limited thereto.

Please refer to FIG. 6A, in the OLED device 70A, the first light emitting units 100 and the second light emitting units 200 may have square shapes as viewed from a top view perspective, and the third light emitting units 300 may have an elliptical shape as viewed from a top view perspective. Each one of the first light emitting units 100 may be arranged between two second light emitting units 200 and between two third light emitting units 300, but the present disclosure is not limited thereto.

Please refer to FIG. 6B, in the OLED device 70B, the first light emitting units 100 may have a strip shape as viewed from a top view perspective, and the second light emitting units 200 and the third light emitting units 300 may have elliptical shapes as viewed from a top view perspective. One second light emitting unit 200 and one third light emitting unit 300 may be arranged between two first light emitting units 100, but the present disclosure is not limited thereto.

Please refer to FIG. 6C, in the OLED device 70C, the first light emitting units 100, the second light emitting units 200 and the third light emitting units 300 may have rectangular shapes. The second light emitting units 200 and the third light emitting units 300 may be staggered for forming multiple columns, the first light emitting units 100 may be arranged adjacent to one another for forming multiple columns, and the columns formed from the second light emitting units 200 and the third light emitting units 300 are located between the columns formed from the first light emitting units 100, but the present disclosure is not limited thereto.

In the above embodiments, the OLED devices 10 to 70C may be applied in flexible display devices, touch display devices, curved display device, and the like, but the present disclosure is not limited thereto.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode device, comprising:
a substrate;
a first light emitting unit disposed on the substrate, comprising:
a first organic light emitting layer and a second organic light emitting layer; and
a first charge generation unit located between the first organic light emitting layer and the second organic light emitting layer, wherein the first organic light emitting layer and the second organic light emitting layer are respectively in contact with a top surface and a bottom surface of the first charge generation unit; and
a second light emitting unit disposed on the substrate, wherein the second light emitting unit comprises a third organic light emitting layer, and the second light emitting unit does not comprise a charge generation unit,
wherein the first charge generation unit is a multi-layered structure comprising a charge generation layer, an electron transport layer and a hole transport layer, and the charge generation layer is located between the electron transport layer and the hole transport layer.

2. The organic light emitting diode device according to claim 1, wherein the first organic light emitting layer extends and is in contact with the third organic light emitting layer.

3. The organic light emitting diode device according to claim 2, wherein an energy gap between the lowest unoccupied molecular orbital of a material of the first organic light emitting layer and the lowest unoccupied molecular orbital of a material of the third organic light emitting layer is larger than or equal to 0 eV and smaller than or equal to 0.5 eV.

4. The organic light emitting diode device according to claim 1, further comprising:
a third light emitting unit disposed on the substrate, wherein the third light emitting unit comprises a fourth organic light emitting layer, and the third light emitting unit does not comprises a charge generation unit.

5. The organic light emitting diode device according to claim 4, wherein the first organic light emitting layer extends and is in contact with the fourth organic light emitting layer.

6. The organic light emitting diode device according to claim 5, wherein the first organic light emitting layer comprises an electron transport material.

7. The organic light emitting diode device according to claim 5, wherein an energy gap between the lowest unoccupied molecular orbital of a material of the first organic light emitting layer and the lowest unoccupied molecular orbital of a material of the fourth organic light emitting layer is larger than or equal to 0 eV and smaller than or equal to 0.5 eV.

8. The organic light emitting diode device according to claim 1, further comprising:
a third light emitting unit disposed on the substrate, wherein the third light emitting unit comprises:
two fourth organic light emitting layers; and
a second charge generation unit located between the two fourth organic light emitting layers, wherein the two fourth organic light emitting layers are respectively in contact with a top surface and a bottom surface of the second charge generation unit.

9. The organic light emitting diode device according to claim 1, wherein the second light emitting unit further comprises:
a fourth organic light emitting layer overlapped with the third organic light emitting layer, wherein the third organic light emitting layer and the fourth organic light emitting layer have different luminous colors.

10. The organic light emitting diode device according to claim 9, wherein the first organic light emitting layer extends and is in contact with the fourth organic light emitting layer.

11. The organic light emitting diode device according to claim 9, further comprising:
a color filter layer disposed corresponding to the first light emitting unit and the second light emitting unit.

12. The organic light emitting diode device according to claim 11, wherein the color filter layer comprises a first color region, a second color region and a third color region, the first color region is located on the first light emitting unit, the second color region and the third color region are located on the second light emitting unit, and the second color region and the third color region allow lights with different wavelength ranges to pass through.

13. The organic light emitting diode device according to claim 11, further comprising a second electrode layer located on the first organic light emitting layer, wherein a distance between the color filter layer and the second electrode layer is larger than or equal to 0 µm and smaller than or equal to 30 µm.

14. The organic light emitting diode device according to claim 9, further comprising:
a first electrode layer, comprising:
a reflective electrode layer; and
a transparent electrode layer located on a partial surface of the reflective electrode layer; and
a second electrode layer located on the first organic light emitting layer, wherein a fourth color region of the second light emitting unit is corresponding to the transparent electrode layer.

15. The organic light emitting diode device according to claim 14, further comprising a fifth color region located between the fourth color region and the first light emitting unit, wherein a resonance cavity length of the fourth color region is longer than a resonance cavity length of the fifth color region.

16. The organic light emitting diode device according to claim 1, further comprising:
a first electrode layer;
a hole injection layer located on the first electrode layer;
another hole transport layer located on the hole injection layer;
another electron transport layer located on the first organic light emitting layer; and
a second electrode layer located on the another electron transport layer, wherein the first light emitting unit and the second light emitting unit are located between the first electrode layer and the second electrode layer.

17. The organic light emitting diode device according to claim 1, wherein the first charge generation unit is a single-layered structure.

18. The organic light emitting diode device according to claim 1, further comprising a first electrode layer and a second electrode layer, wherein the first light emitting unit and the second light emitting unit are located between the first electrode layer and the second electrode layer, and the first electrode layer or the second electrode layer is a reflective electrode.

19. The organic light emitting diode device according to claim 1, wherein the charge generation layer comprises an N-type doped material or a P-type doped material.

* * * * *